(12) United States Patent  
Choi et al.

(10) Patent No.: US 7,445,962 B2  
(45) Date of Patent: Nov. 4, 2008

(54) STACKED INTEGRATED CIRCUITS PACKAGE SYSTEM WITH DENSE ROUTABILITY AND HIGH THERMAL CONDUCTIVITY

(75) Inventors: Bongsuk Choi, Kyoungki-do (KR); Jae Han Chung, Kyoungki-do (KR); Keon Teak Kang, Kyoungki-do (KR)

(73) Assignee: Stats Chippac Ltd., Singapore (SG)

( * ) Notice: Subject to any disclaimer, the term of this patent is extended or adjusted under 35 U.S.C. 154(b) by 395 days.

(21) Appl. No.: 11/306,148

(22) Filed: Dec. 16, 2005

(65) Prior Publication Data

US 2006/0197209 A1   Sep. 7, 2006

Related U.S. Application Data

(60) Provisional application No. 60/652,219, filed on Feb. 10, 2005.

(51) Int. Cl.  
*H01L 21/00* (2006.01)

(52) U.S. Cl. ...................................... 438/109

(58) Field of Classification Search ................. 257/686, 257/777, 706–712, E21.499; 438/109  
See application file for complete search history.

(56) References Cited

U.S. PATENT DOCUMENTS

| | | | |
|---|---|---|---|
| 5,886,408 A * | 3/1999 | Ohki et al. ................... | 257/720 |
| 6,784,020 B2 | 8/2004 | Lee et al. .................... | 438/106 |
| 6,833,287 B1 | 12/2004 | Hur et al. .................... | 438/107 |
| 6,861,288 B2 * | 3/2005 | Shim et al. ................... | 438/109 |
| 6,867,500 B2 | 3/2005 | Corisis et al. ............... | 257/777 |
| 6,906,415 B2 | 6/2005 | Jiang et al. .................. | 257/723 |
| 6,908,784 B1 | 6/2005 | Farnworth et al. .......... | 438/106 |
| 7,087,989 B2 * | 8/2006 | Nakayama ................... | 257/686 |
| 7,268,426 B2 * | 9/2007 | Warner et al. ............... | 257/707 |
| 7,279,786 B2 * | 10/2007 | Kim ............................ | 257/686 |
| 2003/0057545 A1 * | 3/2003 | Shim et al. ................... | 257/706 |

\* cited by examiner

*Primary Examiner*—Nathan W Ha  
(74) *Attorney, Agent, or Firm*—Mikio Ishimaru

(57) ABSTRACT

A stacked integrated circuits package system is provided providing a first substrate, mounting a first integrated circuit on a second substrate, attaching the first integrated circuit, by a side opposite the second substrate, to the first substrate, mounting a second integrated circuit to the second substrate, connecting the second integrated circuit to the first substrate, and attaching a heat spreader to the second integrated circuit and the first substrate.

20 Claims, 4 Drawing Sheets

STACKED INTEGRATED CIRCUITS PACKAGE SYSTEM WITH DENSE ROUTABILITY AND HIGH THERMAL CONDUCTIVITY

CROSS-REFERENCE TO RELATED APPLICATION(S)

This application claims the benefit of U.S. Provisional Patent Application Ser. No. 60/652,219 filed Feb. 10, 2005, and the subject matter thereof is hereby incorporated herein by reference thereto.

TECHNICAL FIELD

The present invention relates generally to integrated circuit packages and more particularly to a stacked integrated circuits package.

BACKGROUND ART

Modern consumer electronics, such as cellular phones, digital cameras, and music players, require shrinking integrated circuits and packing more integrated circuits into an ever shrinking physical space. Numerous technologies have been developed to meet these requirements. One of these technologies involves stacking the integrated circuits in a single package.

As design requirements demand more integrated circuits to be packed into a stacked integrated circuits package, other critical design problems emerge. One critical problem is physically connecting the integrated circuits to each other as required. Another critical problem is the heat generated by the numerous integrated circuits packed into a stacked integrated circuits package.

Numerous approaches exist attempting to provide an efficient integrated circuit package to stack an ever-increasing number of integrated circuits. Some approaches require the integrated circuits planar dimensions to be staggered allowing for both stacking and electrical connectivity. Other approaches require additional structures, such as interposers, to stack numerous integrated circuits that increase the height of the package. These stacked integrated circuit package approaches do not provide enhanced thermal management or require special stacking structures, again increasing the height of the package.

Thus, a need still remains for an efficient stacked integrated circuits package providing compact stacking and thermal management without the need of special stacking structures. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides providing a first substrate, mounting a first integrated circuit on a second substrate, attaching the first integrated circuit, by a side opposite the second substrate, to the first substrate, mounting a second integrated circuit to the second substrate, connecting the second integrated circuit to the first substrate, and attaching a heat spreader to the second integrated circuit and the first substrate.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. Generally, the device can be operated in any orientation. The same numbers are used in all the figures to relate to the same elements.

The term "horizontal" as used herein is defined as a plane parallel to the conventional wafer surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Figure 1:
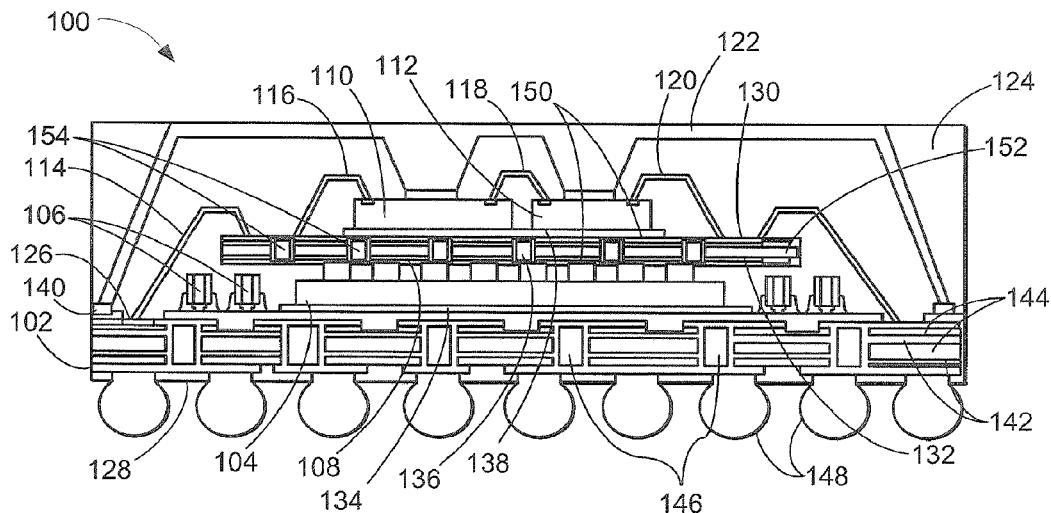
FIG. 1 is a cross-sectional view of a stacked integrated circuits package system in an embodiment of the present invention.

Referring now to FIG. 1, therein is shown a cross-sectional view of a stacked integrated circuits package system 100 in an embodiment of the present invention. The stacked integrated circuits package system 100 includes a first substrate 102, a first integrated circuit 104, components 106, a second substrate 108, a second integrated circuit 110, a third integrated circuit 112, first bond wires 114, second bond wires 116, third bond wires 118, and fourth bond wires 120, and a heat spreader 122 all covered in an encapsulant 124. The first substrate 102 includes a first top surface 126 and a first bottom surface 128. The second substrate 108 includes a second top surface 130 and a second bottom surface 132.

The components 106, such as capacitors, resistors, or other integrated circuits, mount to the first top surface 126. The components 106, such as capacitors or resistors, may be used for a number of functions as filtering, reference voltage, reference currents, or settings for the integrated circuits. The first integrated circuit 104 attaches to the first top surface 126 with a first adhesive layer 134. The attachment of the first integrated circuit 104 to the first substrate 102 provides a maximum surface area for the heat to flow from the first integrated circuit 104 to the first substrate 102 and subsequently to the first bottom surface 128 that is exposed to the next system level (not shown).

First electrical interconnects 136, such as solder bumps or solder bumpers, attach to the first integrated circuit 104 on a side opposite the first adhesive layer 134. The second substrate 108 mounts above the first integrated circuit 104 on the first electrical interconnects 136. The second integrated circuit 110 and the third integrated circuit 112 attach to the second top surface 130 with a second adhesive layer 138.

The heat spreader 122 attaches to the second integrated circuit 110, the third integrated circuit 112, and the first top surface 126. A heat spreader adhesive 140 attaches the heat spreader 122 to the second integrated circuit 110, the third integrated circuit 112, and first top surface 126. The heat spreader 122 provides thermal paths for heat to flow from the second integrated circuit 110 and the third integrated circuit 112 through the heat spreader 122 and subsequently to the external world (not shown). The heat spreader 122 also provides thermal paths for heat to flow from the first substrate 102 to the external world for heat dissipation.

The heat spreader 122 thermally conducts the heat away from the heat generated by the second integrated circuit 110 and the third integrated circuit 112. The attachment of the first integrated circuit 104 to the first substrate 102 provides a thermal dissipation path for the heat to flow away from the first integrated circuit 104. The removal of heat away from each of the heat sources, such as the first integrated circuit 104, the second integrated circuit 110, and the third integrated circuit 112, thereby alleviates heat build up in the stacked integrated circuits package system 100.

The first bond wires 114 connect the first substrate 102 to the second substrate 108. The second bond wires 116 connect the second integrated circuit 110 to the second substrate 108. The third bond wires 118 connect the second integrated circuit 110 to the third integrated circuit 112. The fourth bond wires 120 connect the third integrated circuit 112 to the second substrate 108. It is understood that the second integrated circuit 110 and the third integrated circuit 112 may directly connect to the first substrate 102, as well. For illustrative purposes, all electrical connections are shown as bond wires, although it is understood other electrical interconnects may be used, such as planar interconnects, grid array, and conductive posts.

Between the first top surface 126 and the first bottom surface 128 of the first substrate 102, the first substrate 102 also includes first metal layers 142, first dielectric layers 144, and first vias 146. The first vias 146 connect the first metal layers 142 as required by a design. The first dielectric layers 144 electrically isolate the first metal layers 142 from one another. The first metal layers 142 and the first vias 146 provide numerous electrically conductive paths to electrically connect the first integrated circuit 104, the second integrated circuit 110, the third integrated circuit 112, and the components 106. External electrical structures 148, such as solder balls, are attached to the first bottom surface 128 to be used for external electrical and mechanical attachment, such as to a printed circuit board (not shown).

Similarly, between the second top surface 130 and the second bottom surface 132 of the second substrate 108, the second substrate 108 also includes second metal layers 150, second dielectric layers 152, and second vias 154. The second vias 154 connect the second metal layers 150 as required by a design. The second dielectric layers 152 electrically isolate the second metal layers 150 from one another. The second metal layers 150 and the second vias 154 provide numerous electrically conductive paths to electrically connect the first integrated circuit 104, the second integrated circuit 110, the third integrated circuit 112, and the components 106. The bond wires, the conductive paths in the first substrate 102, and the conductive paths in the second substrate 108 provide a large array of routing and connection possibilities.

Figure 2:
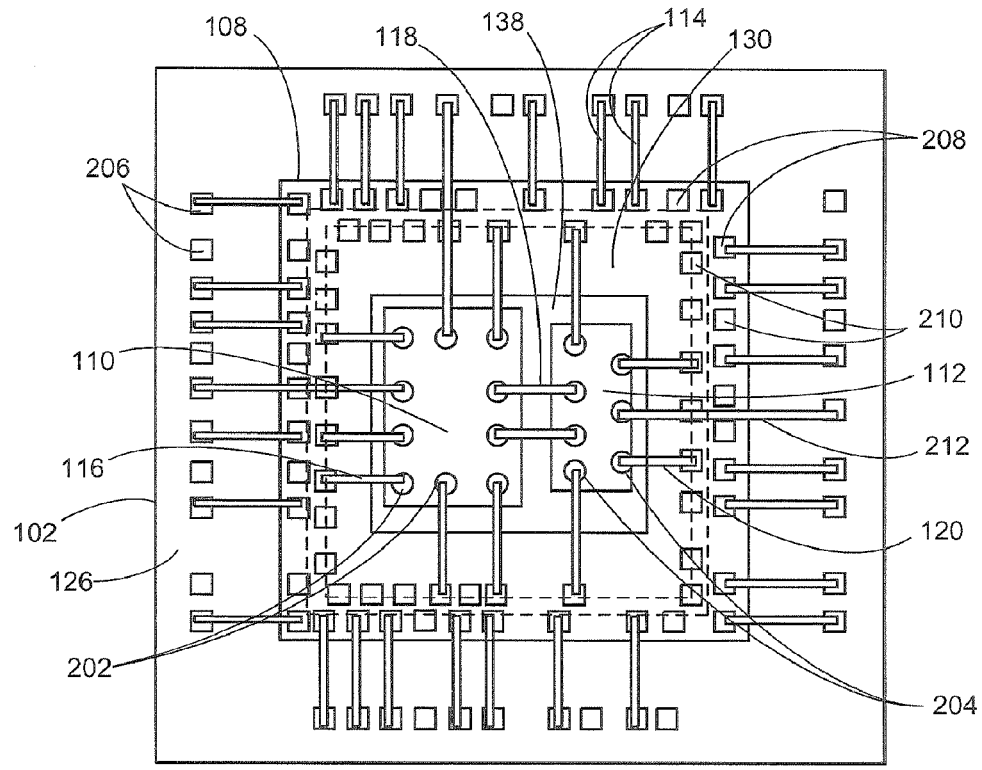
FIG. 2 is a top view of the stacked integrated circuits package system of FIG. 1.

Referring now to FIG. 2, therein is shown a top view of the stacked integrated circuits package system 100 of FIG. 1. The top view shows the second integrated circuit 110 with second bonding pads 202 and the third integrated circuit 112 with third bonding pads 204 mounted on the second top surface 130 with the second adhesive layer 138. The electrical connections to the second integrated circuit 110 attach to the second bonding pads 202. The electrical connections to the third integrated circuit 112 attach to the third bonding pads 204. The first top surface 126 is shown beyond the perimeter of the second substrate 108.

The top view also shows first top pads 206 in the first top surface 126 for electrical connection to one of the first metal layers 142 (not shown) of FIG. 1. Second top pads 208 in the second top surface 130 provide electrical connection to one of the second metal layers 150. Examples of metal traces 210 are shown from some of the second top pads 208. The metal traces 210 are part of a top layer of the second metal layers 150 (not shown) of FIG. 1.

The first bond wires 114 connect the first top pads 206 to the second top pads 208 as required by a design. The second bond wires 116 connect the second bonding pads 202 to the second top pads 208 as required by a design. The third bond wires 118 connect the second bonding pads 202 to the third bonding pads 204 as required by a design. The fourth bond wires 120 connect the third bonding pads 204 to the second top pads 208 as required by a design. Fifth bond wires 212 connect the second bonding pads 202 and the third bonding pads 204 to the first top pads 206 as required by the design.

For illustrative purposes, the first top surface 126 is shown as having a homogeneous portion and the first top pads 206, although it is understood that other elements may appear on the first top surface 126 such as the metal routes, the first vias 146, and the components 106. Also for illustrative purposes, the first top pads 206 are aligned with respect to the side of the first top surface 126, although it is understood the first top pads 206 may be staggered or a combination thereof.

Figure 3:
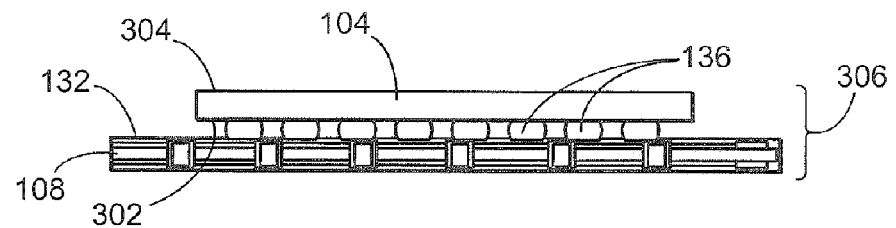
FIG. 3 is a cross-sectional view of the stacked integrated circuits package system in a die attach phase.

Referring now to FIG. 3, therein is shown a cross-sectional view of the stacked integrated circuits package system 100 in a die attach phase. The first integrated circuit 104 includes a first active side 302 and a first backside 304. The circuits have been fabricated on the first active side 302. The electrical connections of the first integrated circuit 104 are shown as a grid array. The first electrical interconnects 136 attach to the first active side 302. For illustrative purposes, the first electrical interconnects 136 are shown as solder bumpers, although it is understood other electrical structures may be used such as solder balls, conductive posts, or stud bumps.

The first integrated circuit 104 mounts on the second bottom surface 132 of the second substrate 108 forming a second substrate subassembly 306. The first electrical interconnects 136 connect to the landing grid pads (not shown) of the second bottom surface 132. The first integrated circuit 104 undergoes reflow to attach the first electrical interconnects 136 to the second bottom surface 132. After the reflow phase, underfill material is applied and cured to minimize movement and breakage of the first electrical interconnects 136 during subsequent manufacturing phases. For illustrative purposes, the underfill material is cured between the first integrated circuit 104 and the second substrate 108 as well as between the first electrical interconnects 136, although it is understood that underfill material may be used for mechanical support.

Figure 4:
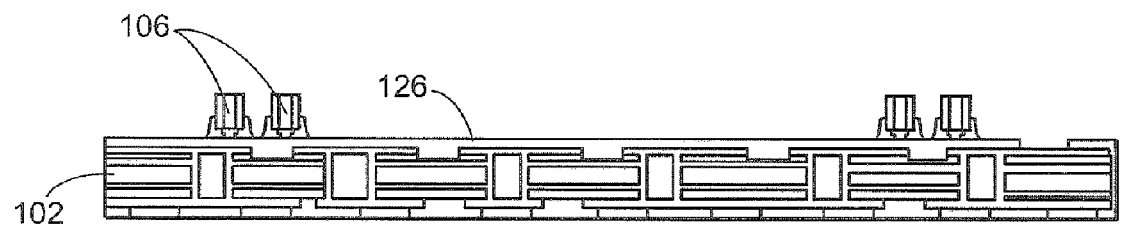
FIG. 4 is a cross-sectional view of the stacked integrated circuits package system in the components attach phase.

Referring now to FIG. 4, therein is shown a cross-sectional view of the stacked integrated circuits package system 100 in a components attach phase. During this phase, the components 106 mount to the first top surface 126 of the first substrate 102. The components 106 connect to the first top pads 206 (not shown) of FIG. 2 by a number of possible processes such as surface mount technology (SMT). For illustrative purposes, the components 106 are shown mounted near the periphery of the first top surface 126, although it is understood that the components 106 may be mounted elsewhere.

Figure 5:
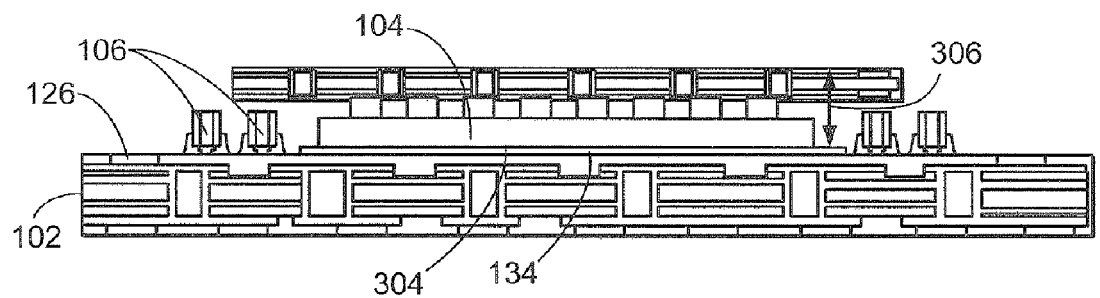
FIG. 5 is a cross-sectional view of the stacked integrated circuits package system in a substrate attach phase.

Referring now to FIG. 5, therein is shown a cross-sectional view of the stacked integrated circuits package system 100 in a substrate attach phase. During this phase, the second substrate subassembly 306 mounts to the first top surface 126 between the components 106. The first backside 304 attaches to the first top surface 126 with the first adhesive layer 134. The first adhesive layer 134 may be applied in a number of different methods, such as using dispensing paste or film adhesive. The first adhesive layer 134 provides mechanical adhesion as well as permits thermal flow from the first integrated circuit 104 to the first substrate 102.

For illustrative purposes, the second substrate subassembly 306 mounts to the first top surface 126 between the components 106, although it is understood that the second substrate subassembly 306 may mount in different relative locations to the components 106. It is also understood that any number of instances of the second substrate subassembly 306 may mount to the first top surface 126.

Figure 6:
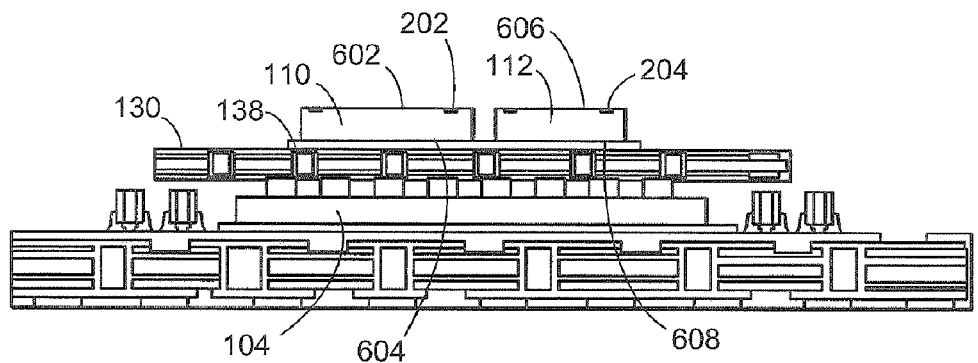
FIG. 6 is a cross-sectional view of the stacked integrated circuits package system in a die stacking phase.

Referring now to FIG. 6, therein is shown a cross-sectional view of the stacked integrated circuits package system 100 in a die stacking phase. The second integrated circuit 110 includes a second active side 602 with circuits fabricated thereon and a second backside 604. The third integrated circuit 112 includes a third active side 606 with circuits fabricated thereon and a third backside 608. During this phase, the second backside 604 and the third backside 608 mount on the second top surface 130 with the second adhesive layer 138. The second adhesive layer 138 may be applied in any number of methods, such as using dispensing paste or film adhesive, followed by an adhesive cure phase. The second integrated circuit 110 and the third integrated circuit 112 mount on the same plane above the first integrated circuit 104. The second active side 602 includes the second bonding pads 202 for electrical connection. The third active side 606 includes the third bonding pads 204 for electrical connection.

For illustrative purposes, the second integrated circuit 110 and the third integrated circuit 112 are shown as different, although it is understood that they may be the same or similar. The second integrated circuit 110 and the third integrated circuit 112 are shown as mounted to the second top surface 130 with space between them, although it is understood that the second integrated circuit 110 and the third integrated circuit 112 may abut next to each.

Figure 7:
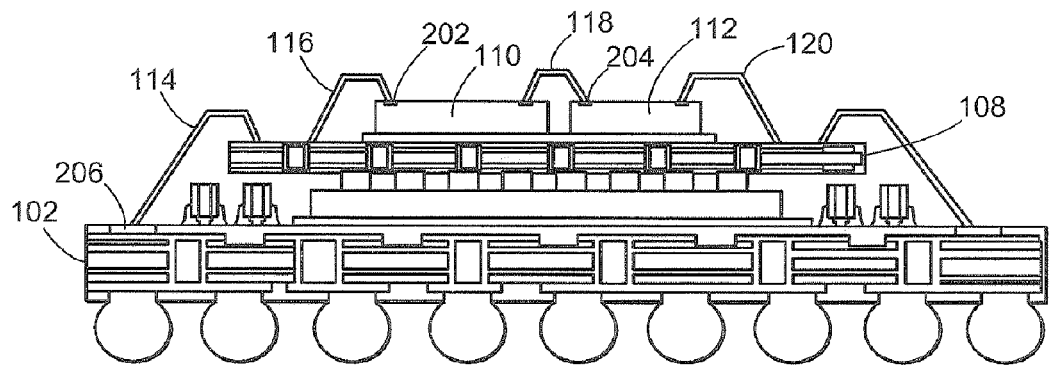
FIG. 7 is a cross-sectional view of the stacked integrated circuits package system in an electrical connection phase.

Referring now to FIG. 7, therein is shown a cross-sectional view of the stacked integrated circuits package system 100 in an electrical connection phase. The first bond wires 114 connect the first top pads 206 to the second top pads 208 (not shown) of FIG. 2 as required by a design. The second bond wires 116 connect the second bonding pads 202 to the second top pads 208 as required by a design. The third bond wires 118 connect the second bonding pads 202 to the third bonding pads 204 as required by a design. The fourth bond wires 120 connect the third bonding pads 204 to the second top pads 208 as required by a design.

For illustrative purposes, the first bond wires, the second bond wires 116, the third bond wires 118, and the fourth bond wires 120 are shown as the electrical interconnects, although it is understood that other electrical structures may be used such as conductive posts and planar interconnects.

Figure 8:
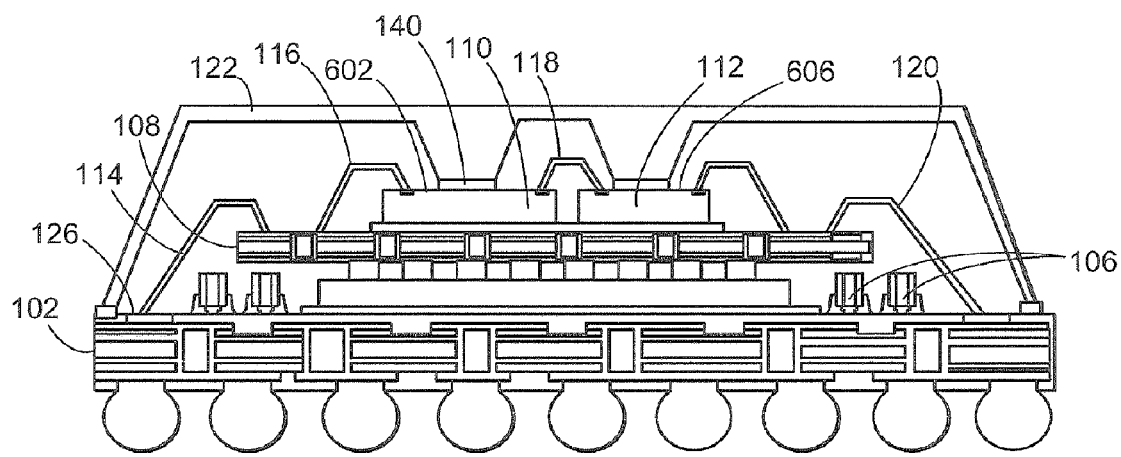
FIG. 8 is a cross-sectional view of the stacked integrated circuits package system in a heat spreader phase.

Referring now to FIG. 8, therein is shown a cross-sectional view of the stacked integrated circuits package system 100 in a heat spreader phase. During this phase, the heat spreader 122 is attached to the second active side 602, the third active side 606, and the first top surface 126 with the heat spreader adhesive 140. The heat spreader adhesive 140 may be any number of compounds such as epoxy with thermal grease. The thermal grease helps conduct heat from the second integrated circuit 110, the third integrated circuit 112, and the first substrate to the heat spreader 122.

The heat spreader 122 covers the first top surface 126 of the first substrate 102, the first integrated circuit 104, the components 106, the second substrate 108, the second integrated circuit 110, the third integrated circuit 112, the first bond wires 114, the second bond wires 116, the third bond wires 118, the fourth bond wires 120, and the fifth bond wires 212 (not shown) of FIG. 2. The heat spreader 122 provides a large surface area to dissipate heat and may be made from any thermally conductive materials, typically metal such as copper, aluminum, or gold.

Figure 9:
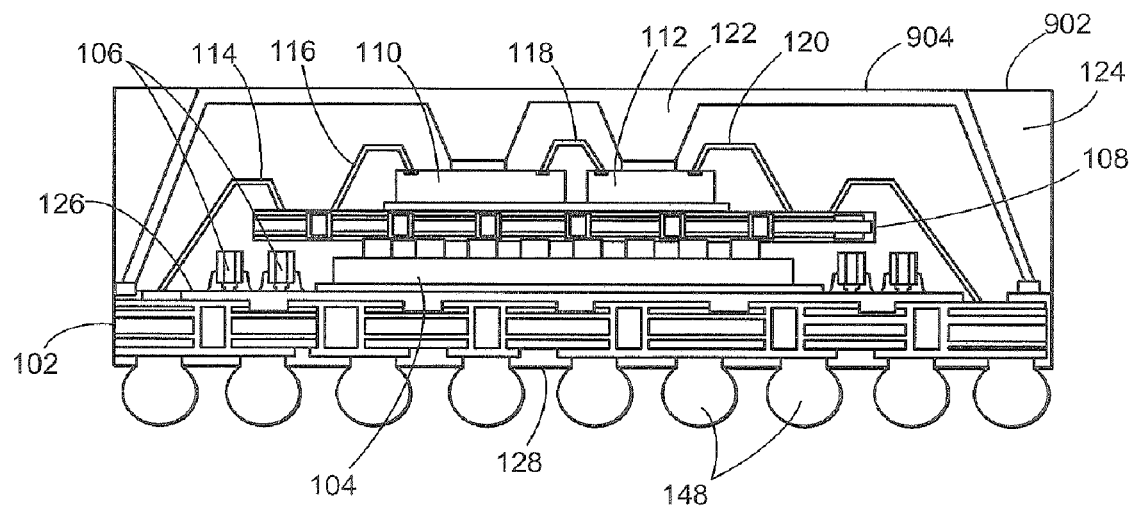
FIG. 9 is a cross-sectional view of the stacked integrated circuits package system in a molding phase.

Referring now to FIG. 9, therein is shown a cross-sectional view of the stacked integrated circuits package system 100 in a molding phase. During this phase, the encapsulant 124 is molded and protects the heat spreader 122, the first top surface 126 of the first substrate 102, the first integrated circuit 104, the components 106, the second substrate 108, the second integrated circuit 110, the third integrated circuit 112, the first bond wires 114, the second bond wires 116, the third bond wires 118, the fourth bond wires 120, and the fifth bond wires 212 (not shown) of FIG. 2. A post mold cure process is applied to the encapsulant 124. A chemical mechanical planarization (CMP) process may be applied to a top encapsulant surface 902 exposing a top heat spreader surface 904.

Next, the external electrical structures 148 attach to the first bottom surface 128. The stacked integrated circuits package system 100 is singulated to separate a single instance.

Figure 10:
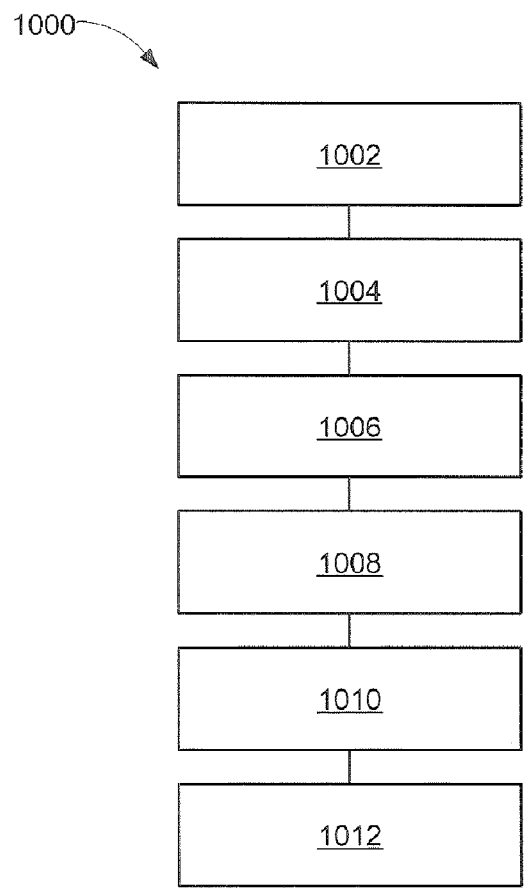
FIG. 10 is flow chart of a stacked integrated circuits package system in an embodiment of the present invention for manufacturing a stacked integrated circuits package system.

Referring now to FIG. 10, therein is shown a flow chart of a stacked integrated circuits package system 1000 in an embodiment of the present invention for a stacked integrated circuits package system such as the system 100. The stacked integrated circuits package system 1000 includes providing a first substrate in a block 1002; mounting a first integrated circuit on a second substrate in a block 1004; attaching the first integrated circuit, by a side opposite the second substrate, to the first substrate in a block 1006; mounting a second integrated circuit to the second substrate in a block 1008; connecting the second integrated circuit to the first substrate in a block 1010; and attaching a heat spreader to the second integrated circuit and the first substrate in a block 1012.

It has been discovered that the present invention thus has numerous aspects.

It has been discovered that multi-purpose structures in stacked integrated circuits packages enable smaller packages with increased number of integrated circuits. Structures used to construct a stacked integrated circuits package also provide thermal management and electrical connectivity both inside and external to the package.

An aspect is that the present invention provides thermal management directing heat flow away from the heat sources, such as the integrated circuits, to the exterior of the package for heat dissipation. This thermal management is achieved by the integrated circuits in each of the stack level connected to either a heat spreader or a heat sink providing a thermally conductive path away from other integrated circuits. The first integrated circuit is thermally attached to the first substrate such that the first substrate with the attachment to the heat spreader forms a heat sink for the first integrated circuit.

Another aspect of the present invention is the numerous electrical connectivity options to create the electrical connections. As more integrated circuits are packed into a single package, connecting the integrated circuits with each other and the next system level becomes increasingly difficult. The base or main package substrate and the stacking substrate provide metal traces for more signal routing options. In addition, various die attach technologies may be used such as wire bond and flip-chip. Along with the various die attach technologies, numerous electrical interconnects may be used to connect the integrated circuits with each other, to the substrates, between substrates, and to the next system level.

Yet another important aspect of the present invention is that it valuably supports and services the historical trend of reducing costs, simplifying systems, and increasing performance. These and other valuable aspects of the present invention consequently further the state of the technology to at least the next level.

Thus, it has been discovered that the stacked integrated circuits package system method of the present invention furnish important and heretofore unknown and unavailable solutions, capabilities, and functional aspects for increasing chip density in systems while making the multiple device packages easier to manufacture reliably. The resulting processes and configurations are straightforward, cost-effective, uncomplicated, highly versatile and effective, can be implemented by adapting known technologies, and are thus readily suited for efficiently and economically manufacturing large die integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth hithertofore or shown in the accompanying drawings are to be interpreted in an illustrative and non-limiting sense.

What is claimed is:

1. A stacked integrated circuits package system comprising:
   providing a first substrate;
   mounting a first integrated circuit on a second substrate;
   attaching the first integrated circuit, by a side opposite the second substrate, to the first substrate;
   mounting a second integrated circuit to the second substrate;
   connecting the second integrated circuit to the first substrate; and
   attaching a heat spreader to the second integrated circuit and the first substrate.

2. The system as claimed in claim 1 wherein attaching the first integrated circuit to the first substrate, on a side opposite the second substrate, and attaching the heat spreader to the first integrated circuit forms a heat sink for the first substrate.

3. The system as claimed in claim 1 further comprising molding an encapsulant over the first integrated circuit and the second integrated circuit.

4. The system as claimed in claim 1 wherein mounting a first integrated circuit on a second substrate comprises attaching electrical interconnects between the first integrated circuit and the second substrate.

5. The system as claimed in claim 1 wherein connecting the second integrated circuit to the first substrate comprises attaching electrical interconnects between the second integrated circuit and the first substrate.

6. A stacked integrated circuits package system comprising:
   providing a first substrate;
   forming first electrical interconnects on a first integrated circuit;
   mounting a second substrate on the first electrical interconnects and over the first integrated circuit;
   attaching the first integrated circuit, a side opposite the first electrical interconnects, on the first substrate;
   stacking a second integrated circuit and a third integrated circuit on a side opposite the first electrical interconnects of the second substrate;
   electrically connecting the second integrated circuit and the third integrated circuit to each other or the second substrate or the first substrate;
   connecting a heat spreader to the second integrated circuit, the third integrated circuit, and the first substrate; and
   molding an encapsulant over the first integrated circuit, the second integrated circuit, the third integrated circuit, the second substrate, the heat spreader, and the first substrate.

7. The system as claimed in claim 6 wherein forming the first electrical interconnects on the first integrated circuit comprises forming solder bumpers.

8. The system as claimed in claim 6 wherein attaching the first integrated circuit, the side opposite the first electrical interconnects, on the first substrate comprises attaching a first adhesive layer between the first integrated circuit and the first substrate.

9. The system as claimed in claim 6 wherein stacking a second integrated circuit and a third integrated circuit on a side opposite the first electrical interconnects of the second substrate comprises attaching a second adhesive layer between the second integrated circuit and the second substrate, and the third integrated circuit and the second substrate.

10. The system as claimed in claim 6 wherein connecting the heat spreader to the second integrated circuit, the third integrated circuit, and the first substrate comprises attaching a heat spreader adhesive from the heat spreader to the second integrated circuit, the third integrated circuit, and the first substrate.

11. A stacked integrated circuits package system comprising:
   a first substrate;
   a first integrated circuit on a second substrate, wherein the first integrated circuit, by a side opposite the second substrate, on the first substrate;
   a second integrated circuit to the second substrate, wherein the second integrated circuit connected to the first substrate; and
   a heat spreader on the second integrated circuit and the first substrate.

12. The system as claimed in claim 11 wherein the heat spreader on the second integrated circuit and the first substrate and attached to the first integrated circuit comprises a heat sink for the first substrate.

13. The system as claimed in claim 11 further comprising an encapsulant over the first integrated circuit and the second integrated circuit.

14. The system as claimed in claim 11 wherein the first integrated circuit on a second substrate comprises electrical interconnects between the first integrated circuit and the second substrate.

15. The system as claimed in claim 11 wherein the second integrated circuit to the first substrate comprises electrical interconnects between the second integrated circuit and the first substrate.

16. A stacked integrated circuits package system comprising:
- a first substrate;
- first electrical interconnects on a first integrated circuit;
- a second substrate on the first electrical interconnects and over the first integrated circuit, wherein the first integrated circuit, a side opposite the first electrical interconnects, on the first substrate;
- a second integrated circuit and a third integrated circuit on a side opposite the first electrical interconnects of the second substrate, wherein the second integrated circuit and the third integrated circuit connected to each other or the second substrate or the first substrate;
- a heat spreader to the second integrated circuit, the third integrated circuit, and the first substrate; and
- an encapsulant over the first integrated circuit, the second integrated circuit, the third integrated circuit, the second substrate, the heat spreader, and the first substrate.

17. The system as claimed in claim 16 wherein the first electrical interconnects on the first integrated circuit comprises forming solder bumpers.

18. The system as claimed in claim 16 wherein the first integrated circuit, the side opposite the first electrical interconnects, on the first substrate comprises a first adhesive layer between the first integrated circuit and the first substrate.

19. The system as claimed in claim 16 wherein a second integrated circuit and a third integrated circuit on a side opposite the first electrical interconnects of the second substrate comprises a second adhesive layer between the second integrated circuit and the second substrate, and the third integrated circuit and the second substrate.

20. The system as claimed in claim 16 wherein the heat spreader to the second integrated circuit, the third integrated circuit, and the first substrate comprises a heat spreader adhesive from the heat spreader to the second integrated circuit, the third integrated circuit, and the first substrate.

* * * * *